United States Patent [19]
Beyer et al.

[11] Patent Number: 5,227,658
[45] Date of Patent: Jul. 13, 1993

[54] BURIED AIR DIELECTRIC ISOLATION OF SILICON ISLANDS

[75] Inventors: Klaus D. Beyer; San-Mei Ku, both of Poughkeepsie; Victor J. Silvestri, Hopewell Junction; Andrie S. Yapsir, Pleasant Valley, all of N.Y.

[73] Assignee: International Business Machines Corporation, Armonk, N.Y.

[21] Appl. No.: 781,429

[22] Filed: Oct. 23, 1991

[51] Int. Cl.$^5$ ............................................. H01L 27/12
[52] U.S. Cl. ..................................... 257/522; 257/508; 257/770
[58] Field of Search ............... 257/522, 508, 506, 510, 257/513

[56] References Cited
U.S. PATENT DOCUMENTS

| | | | |
|---|---|---|---|
| 4,502,913 | 5/1985 | Lechaton et al. | 156/643 |
| 4,661,832 | 4/1987 | Lechaton et al. | 357/49 |
| 4,888,300 | 12/1989 | Burton | 437/61 |

OTHER PUBLICATIONS

"A New SOI Fabrication Technique for Ultrathin Active Layer of Less the 80 nm", by H. Horie, et al., 1990 Symposium on VLSI Technology.

*Primary Examiner*—Gene M. Munson
*Attorney, Agent, or Firm*—Richard A. Romanchik; Michael J. Balconi-Lamica

[57] ABSTRACT

A method for isolating areas of silicon from a substrate 50 includes the steps of: providing a buried N+ region 52 in the substrate; forming an intrinsic epitaxial layer 12 onto the N+ region; etching trenches 18, 20 through the intrinsic epitaxial layer to thereby form a desired isolation region 16 of intrinsic epitaxial material; laterally etching a cavity 22 underneath the desired isolation region; and, forming an insulation layer 24 of insulation material along the bottom of the desired isolation region exposed by the former etching steps.

6 Claims, 5 Drawing Sheets

BURIED AIR DIELECTRIC ISOLATION OF SILICON ISLANDS

TECHNICAL FIELD

The present invention is related to the isolation of active devices on a silicon chip, and more particularly, to the complete isolation of regions of silicon from a substrate material utilizing air as a dielectric.

BACKGROUND ART

It is well known in the art to isolate regions of silicon from one another on a silicon substrate for the purpose of making active devices in the isolated regions. Early attempts at completely isolating these regions involve lateral isolation techniques by forming a trench around an island of semiconductor material to be isolated and filling the trench with an insulating material such as oxide. An example of this technique can be found in commonly owned U.S. Pat. No. 4,661,832 (Lechaton, et al.).

More recent techniques for isolating regions of semiconductor material have been accomplished by completely isolating the regions not only laterally from adjacent areas but also vertically from the substrate from which it is supported. Examples of this isolation technique can be found in U.S. Pat. No. 4,888,300 (Burton) and "A New SOI Fabrication Technique for Ultrathin Active Layer of Less the 80 nm" by H. Horie, K. Oikawa, H. Ishiwari, T. Yamazaki and S. Ando; Fujitsu Laboratories, Ltd.; 1990 Symposium on VLSI Technology IEEE (Horie, et al.).

Burton teaches a method of isolating active semiconductor regions by utilizing the different etch responsiveness of a buried region in order to form a submerged wall insulating layer between a substrate and an active area. After a standard buried layer has been formed in the substrate through conventional techniques, (e.g., epitaxial processing), a trench is cut into the epitaxial layer to provide access to the buried layer. Then, while suspending in place the portion of the epitaxial layer surrounded by the trench, (by means of an oxide bridge), the underlying region of the buried layer is etched away to form a cavity under the active area. This cavity, as well as the surrounding trench, is filled with a suitable insulating material to thereby isolate the active island from the substrate. An example of a suitable insulating material taught by Burton is polysilicon.

A similar isolation technique is disclosed by Horie, et al.

Although the "floating island" technique taught by Burton and Horie, et al. for isolating semiconductor regions is superior to earlier isolation methods, it is not without problems which render it ineffective. In particular, polysilicon trench structures having an oxide trench sidewall as taught by Burton and Horie, et al. produce a tremendous amount of thermal stress at the interface of the trench or cavity wall and the semiconductor substrate. This stress is manifested in silicon areas by stress induced dislocations which begin at vertical silicon/trench or cavity interfaces and extend into adjacent isolated silicon regions. The structural integrity of the silicon region due to these dislocations is consequently compromised, rendering devices built thereon unreliable.

In addition to the above mentioned problem caused by stress induced dislocations, the floating silicon region is subject to separation problems caused by the formation of oxide wedges resultant from subsequent oxidation steps performed to build devices into or onto the floating silicon region. This occurs because the only exposed areas along the interface between the isolated silicon region and the support structure underneath is at the junction where the vertical walls of the region meet the supporting structure. These oxide wedges compress the isolated silicon region upwards or vertically, and consequently cause additional stress dislocations.

For the above reasons it has been found that the techniques of Burton and Horie, et al. are unacceptable for manufacturing processes. An isolation system which overcomes these deficiencies is therefore highly desirable.

DISCLOSURE OF THE INVENTION

An object of the present invention is to provide complete isolation of regions of silicon from a surrounding substrate.

Another object of the present invention is to provide isolation of regions of silicon while also providing a convenient means for interconnecting the isolated regions.

According to the present invention, a technique for isolating regions of silicon from a surrounding substrate includes the steps of: providing a N+buried layer on the substrate; forming an epitaxial layer of silicon onto the buried N+ layer; vertically etching a pair of trenches through the epi layer to the N+ layer, thereby forming an isolation region; performing a lateral etch into the N+ layer to thereby form a cavity under the isolation region; and, forming an insulation layer on the bottom of the isolation region and on the walls of the cavity at the ends of the isolation region to thereby suspend the isolation region above the cavity.

A second technique according to the present invention includes the steps of: providing a buried N+ layer on a substrate; forming an epitaxial layer of silicon onto the buried N+ layer; vertically etching a pair of trenches through the epi layer to the N+ layer, thereby forming an isolation region; forming an insulating sidewall onto the sides of the isolation region; performing a lateral etch into the N+ layer underneath the isolation region to thereby form a cavity under the isolation region; forming a conductive layer onto the bottom of the isolation region and on the walls of the cavity at the ends of the isolation region; and, forming an insulation layer onto the conductive layer.

The present invention provides for complete isolation of regions of silicon. These regions are suspended by an insulation layer over an air dielectric and therefore are not susceptible to thermal stress during subsequent processing. Furthermore, a significant portion of the present invention can be produced in the same tool as other processing steps, thereby making it economical compared to prior isolation techniques. The present invention can be customized with isolated structures limited to certain areas of a chip. In addition, isolated structures can be formed at multiple silicon depths to thereby optimize the present isolation application for BiCMOS devices and Bipolar devices.

These and other objects, features and advantages of the present invention become more apparent in light of the detailed description of exemplary embodiments thereof as illustrated by the drawings.

BEST MODE FOR CARRYING OUT THE INVENTION

Figure 1A:
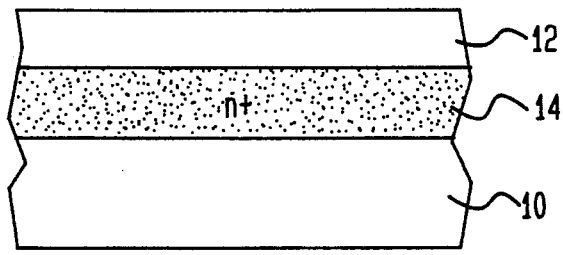
FIGS. 1A-1D are cross sectional views of the steps for producing an isolated silicon region in accordance with a first embodiment of the present invention.

Referring now to FIG. 1A, a substrate 10 comprised of semiconductor material such as P− or N− doped or undoped silicon is provided onto which an intrinsic epitaxial (epi) layer 12 of single crystal silicon is grown. Sandwiched between the substrate 10 and the epitaxial layer 12 is heavily doped buried layer 14, such as N+ or P+ material. This buried layer 14 can be formed using conventional techniques known in the art, for example, by arsenic implantation with a subsequent drive in before the epitaxial layer is grown, or by selectively growing the N+ layer using epitaxial techniques.

Figure 1B:
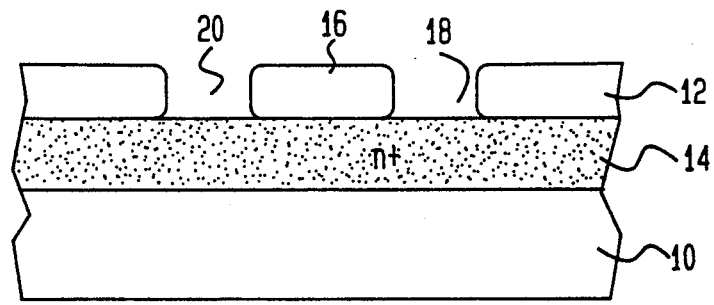

Referring now to FIG. 1B, a pair of trenches 18, 20 are then transferred through the epitaxial layer 12 to a depth sufficient to provide access to the N+ buried layer 14. The trenches may be formed using patterning techniques well known in the art. An acceptable patterning method is to: deposit a masking layer (not shown) onto the substrate; deposit a photo resist onto the masking layer (not shown); expose the pattern through the photo resist; develop the photo resist; etch the pattern through the masking layer using a $CF_4$ RIE; remove the photo resist layer; and, etch the trenches 18, 20 into the substrate using a $SF_6/Cl_2$ RIE.

Trenches 18, 20 thereby form an isolation region 16 upon which devices may thereafter be built.

Figure 1C:
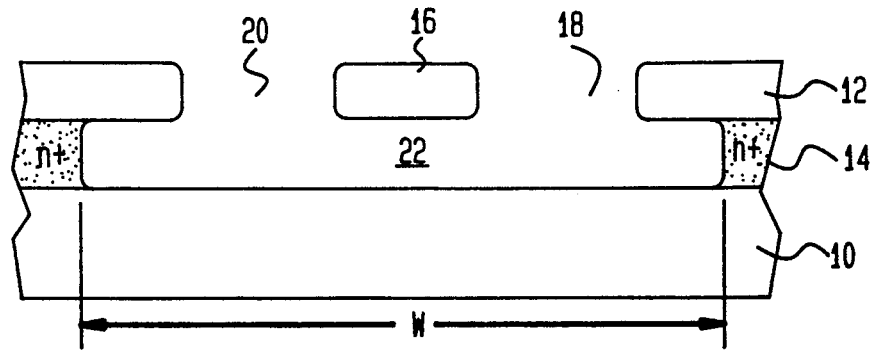

Referring now to FIG. 1C, a portion of the buried layer 14 is then removed by selectively laterally etching the buried layer from below the isolation region 16, thereby forming a cavity 22. The lateral etch utilized may be any of a number of suitable methods well known in the art. For example, a dry plasma etch comprised of $Cl_2$ can be used to remove this layer and form the cavity 22 beneath the isolation region 16. Alternatively, a wet etch can be utilized. The width W of the cavity 22 is dependent upon the time to which the buried layer 14 is exposed to the dry plasma etch.

Figure 1D:
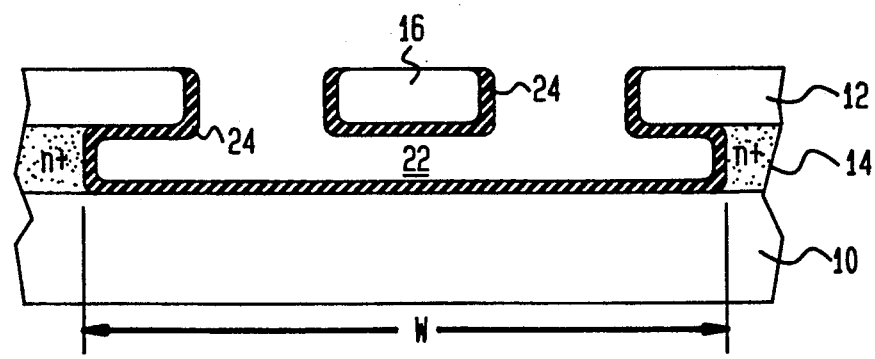

Referring now to FIG. 1D, an insulation layer 24, such as $SiO_2$ is formed onto the walls of the cavity 22 and the sides and bottom of isolation region 16 utilizing methods well known in the art, such as CVD coating methods or thermal oxidation techniques. The insulation layer 24 which coat the bottom of isolation region 16 will be contiguous with the part of insulation layer 24 coating the walls of cavity 22 at the ends (illustrated as reference numbers 25, 26 in FIG. 2D) of the isolation region 16. The insulation layer 24 on the bottom of isolation region 16 therefore suspends it above cavity 22 and provides support for multiple isolation regions produced by further etching steps, as will be described in greater detail hereinafter. It is to be noted that it is not critical to the present invention for the insulation layer 24 to cover the entire exposed surface of the cavity 22. It is only necessary for the insulation layer 24 to contiguously cover the bottom of isolation region 16 and the walls of cavity 22 at the ends of the isolation region 16. It is at these ends 25, 26 where the insulation layer is attached to the surrounding substrate in order to support and suspend the isolation region 16 above cavity 22. The specific areas covered by insulation layer 24 will be dependent upon the specific deposition and patterning technique utilized.

Figure 2A:
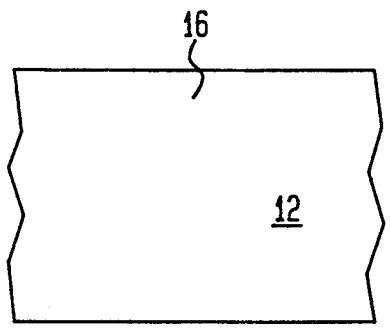
FIGS. 2A-2E are top views of the steps for producing an isolated silicon region in accordance with a first embodiment of the present invention.

Referring now to FIG. 2A, a top view of the process as described in FIGS. 1A-1D shows the intrinsic epi layer 12 which lies over the buried layer 14 and substrate 10 (FIG. 1A).

Figure 2B:
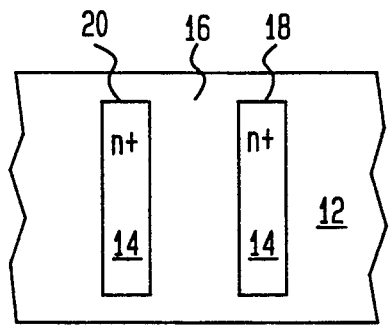

Referring now to FIG. 2B, two trenches 18, 20 are etched through the epi layer 12 to the buried layer 14 to thereby form an isolation region 16.

Figure 2C:
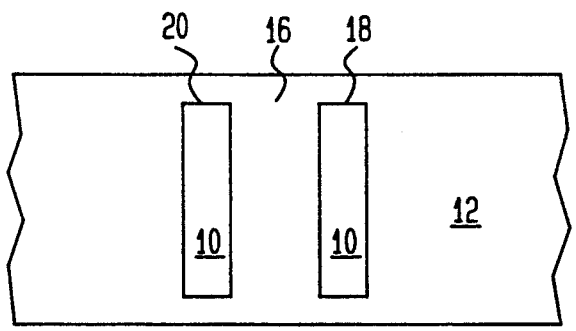

Referring now to FIG. 2C, the buried layer 14 is then laterally etched to thereby form a cavity 22 (FIG. 1C) under the isolation region 16.

Figure 2D:
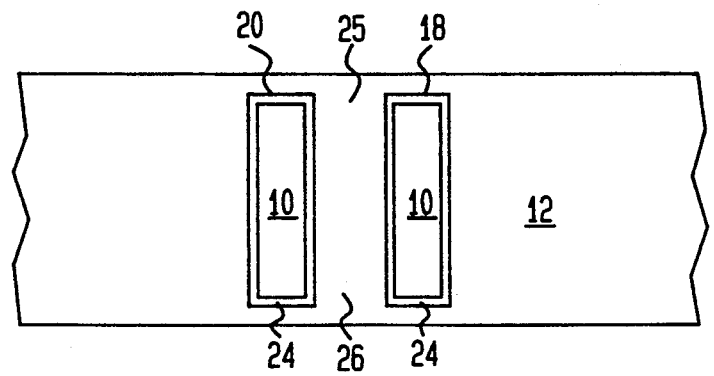

Referring now to FIG. 2D, insulation layer 24 is then formed onto the surfaces of the trenches 18, 20, cavity 22 (FIG. 1D) and isolation region 16 exposed by the aforementioned etching steps.

Figure 2E:
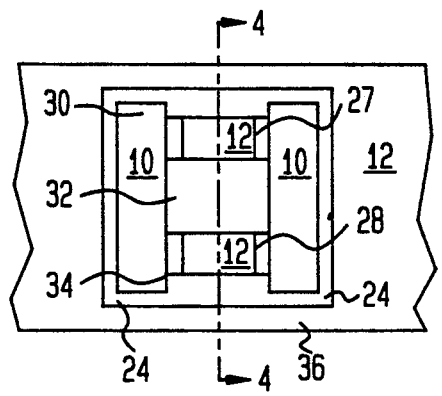

Referring now to FIG. 2E, the isolation region 16 is then "sliced" into multiple smaller isolation regions 27, 28 by selectively etching channels 30-34 across isolation region 16 on both sides of each smaller isolation region 27, 28. This etching step can be any of a number of selective etches well known in the art which etch through an epi layer 12 without disturbing the underlying insulation layer 24, such as a timed $SF_6/Cl_2$ RIE etch. The insulation layer 24 therefore continues to support and suspend the smaller isolation regions 27, 28.

It is to be noted that different patterned shapes and configurations and different etching techniques can be utilized to produce a number of different types of smaller isolation regions. The particular shapes and the number of channels are not critical to the present invention.

It is also to be noted that multiple cavities may be formed at different depths in the silicon substrate in order to accommodate different device applications. For instance, BiCMOS devices may be built on the same substrate as Bipolar devices using this technique in accordance with the present invention.

Figure 3:
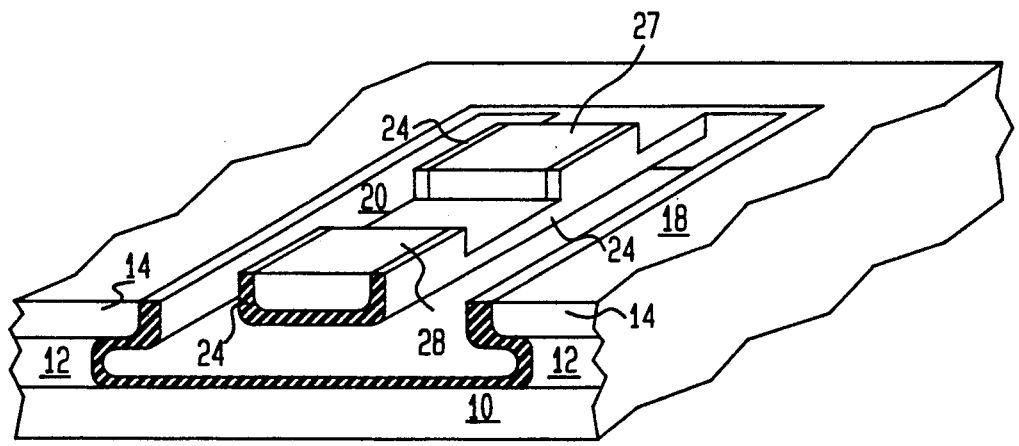
FIG. 3 is an isometric view of isolated silicon regions formed in accordance with a first embodiment of the present invention.

Referring now to FIG. 3, the structure resultant from the process as described in FIGS. 1A-1D and FIGS. 2A-2E comprises a substrate 10, a buried layer 12, an epitaxial layer 14, trenches 18, 20 etched through the epi layer 14, a cavity 22 formed by laterally etching into the buried layer 12, an oxide layer 24 formed on the walls of the cavity 22 and the side walls and bottoms of the smaller isolation regions 27, 28. After channels 30, 32, 34 (see FIG. 2E) have been etched through the isolation region 16, the insulation layer 24 which was formed on the bottom of the region 16 (FIG. 1) now supports the smaller isolation regions 27, 28.

Figure 4:
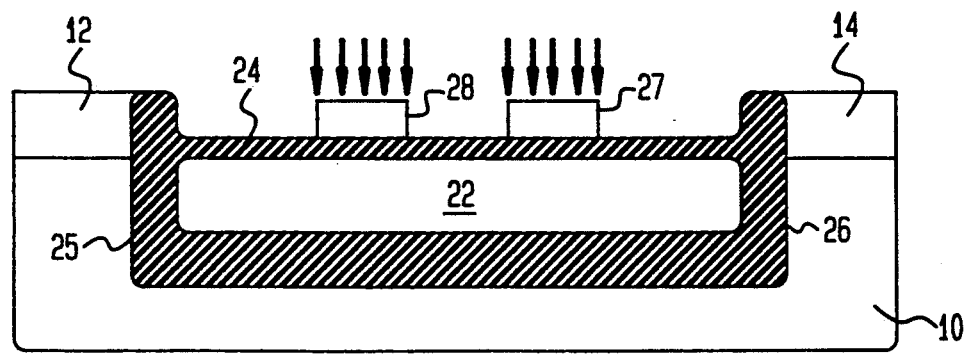
FIG. 4 is a cross sectional view of the structure illustrated in FIG. 2E, taken along line 4—4.

Referring now to FIG. 4, a cross section the structure resultant from the process as described in FIGS. 1A-1D and FIGS. 2A-2E and taken along line 4—4 of FIG. 2E includes a substrate 10, an epitaxial layer 14, isolation regions 27, 28, a cavity 22 formed by laterally etching into the buried layer 12, an oxide layer 24 formed on the walls of the cavity 22 and bottom of the isolation regions 27, 28. Insulation layer 24 supports the individual active areas 27, 28.

It is to be noted that isolated regions 27, 28 may be utilized for any of a number of applications. An example of one such application is to build transistors with the epitaxial silicon as the starting substrate. Another example is to dope the regions 27, 28 in a manner so as to form resistor strips. Accurate, reproducible resistor strips may be created in such a manner. Arrows are utilized in FIG. 4 to illustrate doping the isolated regions in order to form resistors in this manner.

Figure 5A:
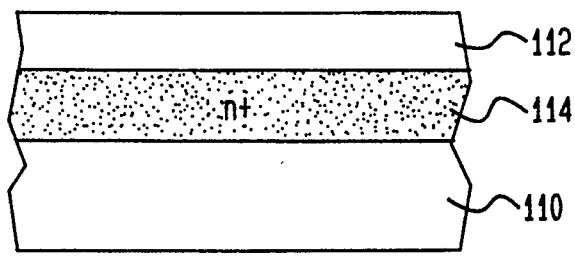
FIGS. 5A-5F are cross sectional views of the steps for producing an isolated silicon region having a built-in interconnection means in accordance with a second embodiment of the present invention.

Referring now to FIG. 5A, a process for practicing a second embodiment in accordance with the present invention begins with a substrate 110, such as P− or N− doped silicon, having an N+ layer 114 provided therein, and having an epitaxial silicon layer 112 formed thereon, as previously described for the first embodiment as illustrated and described in FIG. 1A.

Figure 5B:
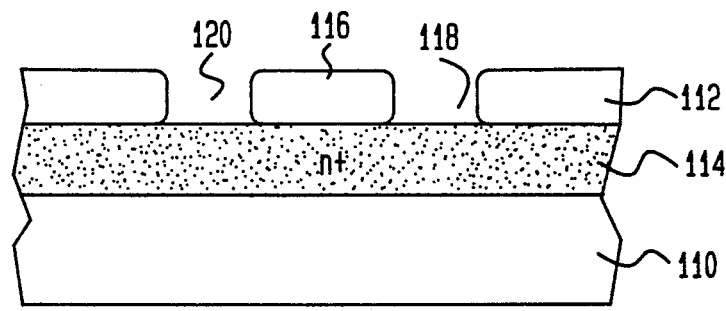

Referring now to FIG. 5B, next, a pair of trenches 118, 120 are etched through epi layer 112, thereby providing an isolation region 116. This etching may be as previously described for the first embodiment as illustrated and described in FIG. 1B.

Figure 5C:
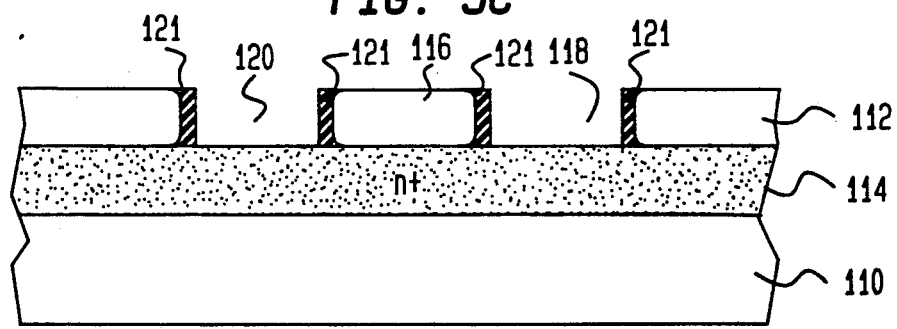

Referring now to FIG. 5C, next, sidewalls 121 of an insulating material, such as oxides, are formed onto the sides of trenches 118, 120. A suitable method to deposit these sidewalls 121 is by CVD deposition.

Figure 5D:
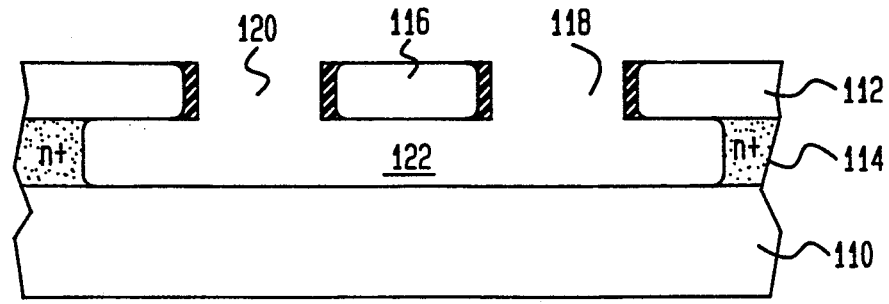

Referring now to FIG. 5D, next, the N+ layer 114 is etched away using a lateral etch as described and illustrated in FIG. 1C to thereby create a cavity 122.

Figure 5E:
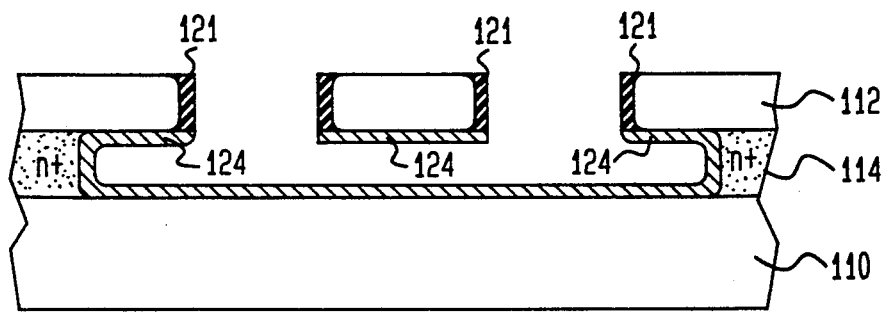

Referring now to FIG. 5E, next, a conductive layer 124 is formed onto the cavity 122 walls and the bottom of isolation region 116. The conductive layer 124 may be any of a number of suitable conductive materials known in the art, such as tungsten or silicides. Suitable methods for forming these types of materials are likewise well known in the art, such as selective CVD deposition, electroplating or metal silicidation. The portion of conductive layer 124 covering the bottom of epi strip 116 may subsequently be utilized to provide connection to devices built into or onto isolation region 116. In the case of metal silicides, the unreacted metal can be removed chemically.

Figure 5F:
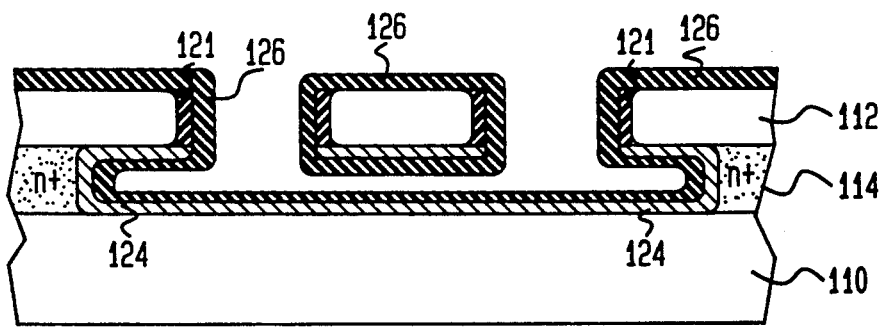

Referring now to FIG. 5F, next, an insulation layer 126 is formed over conductive layer 126 and the rest of the structure. The insulation layer 126 may be any of a number of suitable insulative materials, such as oxides. Suitable methods of forming these types of materials are likewise well known in the art, such as CVD deposition. It is to be noted that eventually, the insulation layer 126 covering the epi region 116 may be removed using a suitable etching process in order to provide processing access to the isolation region 116.

Although the invention has been shown and described with exemplary embodiments thereof, it should be understood by those skilled in the art that the foregoing and various other changes, omissions and additions may be made therein and thereto without department from the spirit and scope of the invention.

We claim:

1. A semiconductor structure comprising:
   a substrate;
   an epitaxial layer of silicon material formed on said substrate;
   a desired isolation region having: a) a strip of said silicon material, said desired isolation region having a top, a bottom, two sides and two ends;
   an air filled cavity in said substrate and said epitaxial layer surrounding said desired isolation region below said bottom and on said two sides; and
   a conductive layer of conductive material formed on said bottom and the walls of said cavity at said ends,
   wherein said conductive layer is adjoined to said substrate at said ends, thereby supporting said desired isolation region and suspending it over said air filled cavity.

2. A semiconductor structure comprising:
   a substrate;
   an epitaxial layer of silicon material formed on said substrate;
   a desired isolation region having a top, a bottom, two sides and two ends;
   a conductive layer of conductive material formed on said bottom;
   an air filled cavity in said substrate and said epitaxial layer surrounding said desired isolation region below said bottom and on said two sides; and,
   an insulation layer of insulation material formed on said conductive layer and the walls of said air filled cavity at said ends,
   wherein said insulation layer is adjoined to said substrate layer at said ends, thereby supporting said desired isolation region and suspending it over said air filled cavity.

3. A semiconductor structure comprising:
   a substrate having a buried region with a characteristic etch response different from that of said substrate;
   an epitaxial layer of silicon material formed on said substrate;
   a desired isolation region of said silicon material having a top, a bottom, two sides and two ends;
   an air filled cavity in said substrate and said epitaxial layer surrounding said desired isolation region below said bottom and on said two sides; and,
   a conductive layer of conductive material formed on said bottom and the walls of said air filled cavity at said ends,
   wherein said air filled cavity is formed by first etching trenches to thereby form said two sides and then laterally etching said buried region to thereby form said bottom, and wherein said conductive layer is adjoined to said substrate at said ends, thereby supporting said desired isolation region and suspending it over said air filled cavity.

4. A semiconductor structure comprising:
   a substrate having a buried region with a characteristic etch response different from that of said substrate;
   an epitaxial layer of silicon material formed on said buried region;
   a desired isolation region of said silicon material having a top, a bottom, two sides and two ends;
   a conductive layer of conductive material formed on said bottom;
   an air filled cavity surrounding said desired isolation region below said bottom and on said two sides; and,
   an insulation layer of insulation material formed on said conductive layer and on the walls of said air filled cavity at said ends,
   wherein said cavity is formed by first etching trenches to thereby form said two sides and then laterally etching said buried region to thereby form said bottom, and wherein said insulation layer supports and suspends said desired isolation region over said air filled cavity.

5. A semiconductor structure according to claims 1 or 3, wherein said desired isolation region is divided into a plurality of smaller desired isolation regions supported by said conductive layer.

6. A semiconductor structure according to claims 2 or 4, wherein said desired isolation region is divided into a plurality of smaller desired isolation regions supported by said insulation layer.

* * * * *